(12) United States Patent  
Hashimoto et al.

(10) Patent No.: US 9,113,566 B2  
(45) Date of Patent: Aug. 18, 2015

(54) ELECTRONIC DEVICE AND PRINTED CIRCUIT BOARD CONNECTION METHOD

(71) Applicant: Fujitsu Limited, Kawasaki-shi (JP)

(72) Inventors: Shohei Hashimoto, Yokohama (JP); Takeshi Nishiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 257 days.

(21) Appl. No.: 13/706,641

(22) Filed: Dec. 6, 2012

(65) Prior Publication Data

US 2013/0223027 A1 Aug. 29, 2013

(30) Foreign Application Priority Data

Feb. 29, 2012 (JP) ................. 2012-044591

(51) Int. Cl.
*H05K 7/14* (2006.01)
*H05K 1/11* (2006.01)
(Continued)

(52) U.S. Cl.
CPC .................. *H05K 1/117* (2013.01); *H05K 3/36* (2013.01); *H05K 7/1418* (2013.01); *H05K 7/1425* (2013.01); *H05K 13/0015* (2013.01); *Y10T 29/49126* (2015.01)

(58) Field of Classification Search
CPC . H05K 1/117; H05K 13/0015; H05K 7/1418; H05K 1/02; H05K 2201/09154; H05K 7/1489
USPC ......... 361/756, 741, 728, 736, 802, 727, 752, 361/633, 636, 785, 788; 439/374, 377, 439/620.15
See application file for complete search history.

(56) References Cited

U.S. PATENT DOCUMENTS 3,899,721 A * 8/1975 Borchard et al. ............. 361/802
5,019,948 A * 5/1991 Steketee et al. .............. 361/802
5,286,212 A * 2/1994 Broeksteeg .................. 439/108
(Continued)

FOREIGN PATENT DOCUMENTS

JP 61-173188 U 10/1986
JP 2-34991 A 2/1990
JP 7-31596 Y2 7/1995

OTHER PUBLICATIONS

Korean Office Action mailed Oct. 24, 2013 for corresponding Korean Application No. 10-2012-0136068, with Partial English-language Translation.

(Continued)

*Primary Examiner* — Lisa Lea Edmonds
*Assistant Examiner* — Keith Depew
(74) *Attorney, Agent, or Firm* — Fujitsu Patent Center

(57) ABSTRACT

An electronic device includes: a casing provided with a first printed circuit board that includes a first connector; a unit inserted into the casing through a housing opening formed in the casing, the unit including a second printed circuit board with a second connector, a pair of guide rails that guide the second connector towards the first connector; a width direction positioning section that is provided to an end portion on the housing opening side of at least one of the guide rails of the pair of guide rails and that positions the second connector in the unit width direction with respect to the first connector; and a top-bottom direction positioning section that is positioned further towards the first connector side than the width direction positioning section and that positions the second connector in the top-bottom direction with respect to the first connector.

8 Claims, 18 Drawing Sheets

(51) Int. Cl.
*H05K 13/00* (2006.01)
*H05K 3/36* (2006.01)

(56) References Cited

U.S. PATENT DOCUMENTS

| | | | | |
|---|---|---|---|---|
| 5,805,429 | A * | 9/1998 | Andersson | 361/799 |
| 6,317,329 | B1 * | 11/2001 | Dowdy et al. | 361/725 |
| 6,359,788 | B1 * | 3/2002 | Giese et al. | 361/756 |
| 6,421,245 | B1 * | 7/2002 | Kashima | 361/737 |
| 7,324,349 | B2 * | 1/2008 | Wobig et al. | 361/756 |
| 8,169,788 | B2 * | 5/2012 | Shouyama et al. | 361/756 |
| 8,325,487 | B2 * | 12/2012 | Yamaguchi et al. | 361/752 |
| 2006/0281346 | A1 * | 12/2006 | Pan | 439/79 |
| 2007/0086175 | A1 * | 4/2007 | Davis et al. | 361/802 |
| 2010/0124034 | A1 * | 5/2010 | Shouyama et al. | 361/756 |
| 2011/0124218 | A1 * | 5/2011 | Huang | 439/374 |
| 2012/0264334 | A1 * | 10/2012 | Laurx et al. | 439/628 |

OTHER PUBLICATIONS

Chinese Office Action mailed Jun. 3, 2015 for corresponding Chinese Patent Application No. 201210506334.7, with English Translation, 20 pages.

* cited by examiner

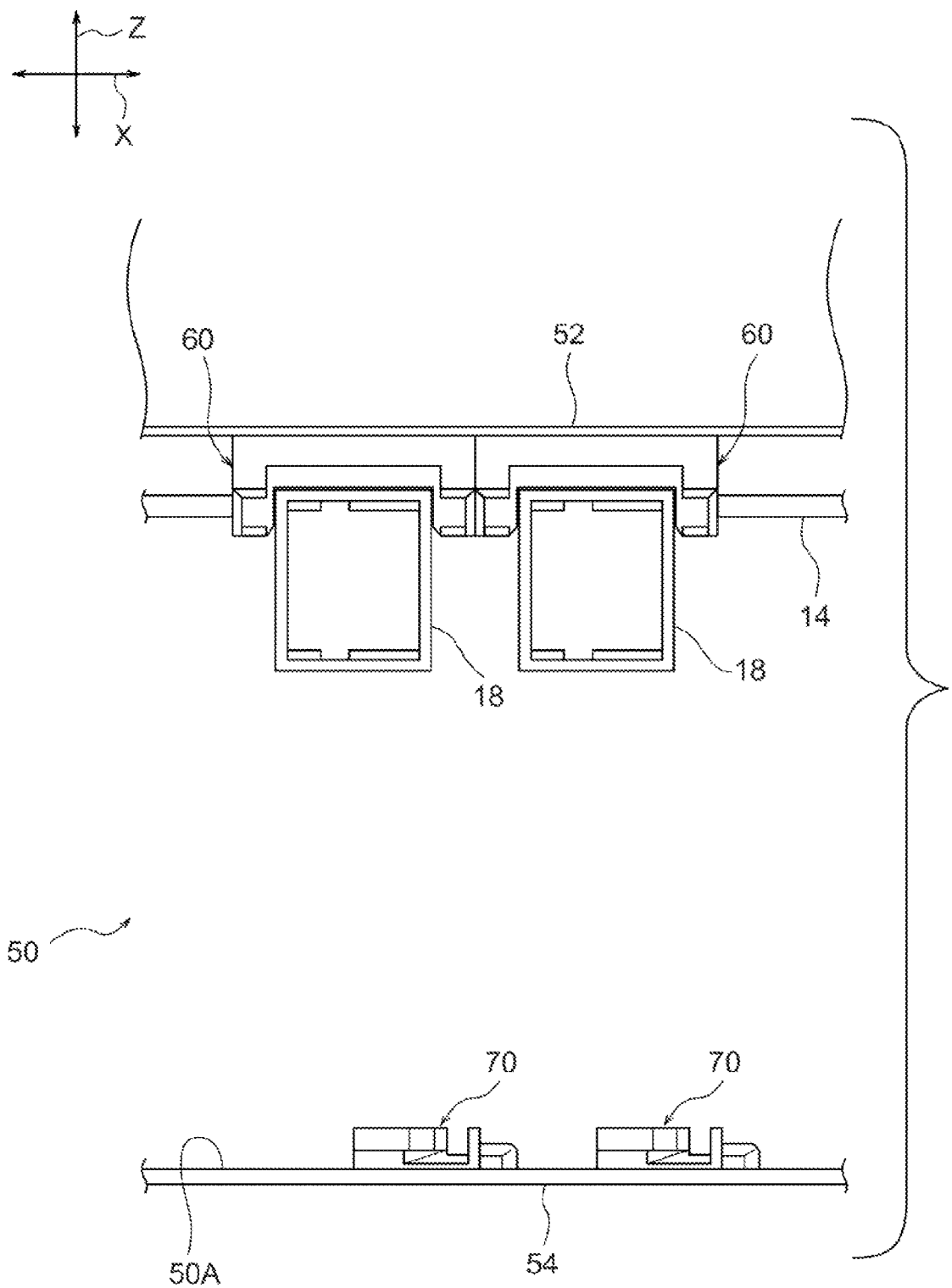

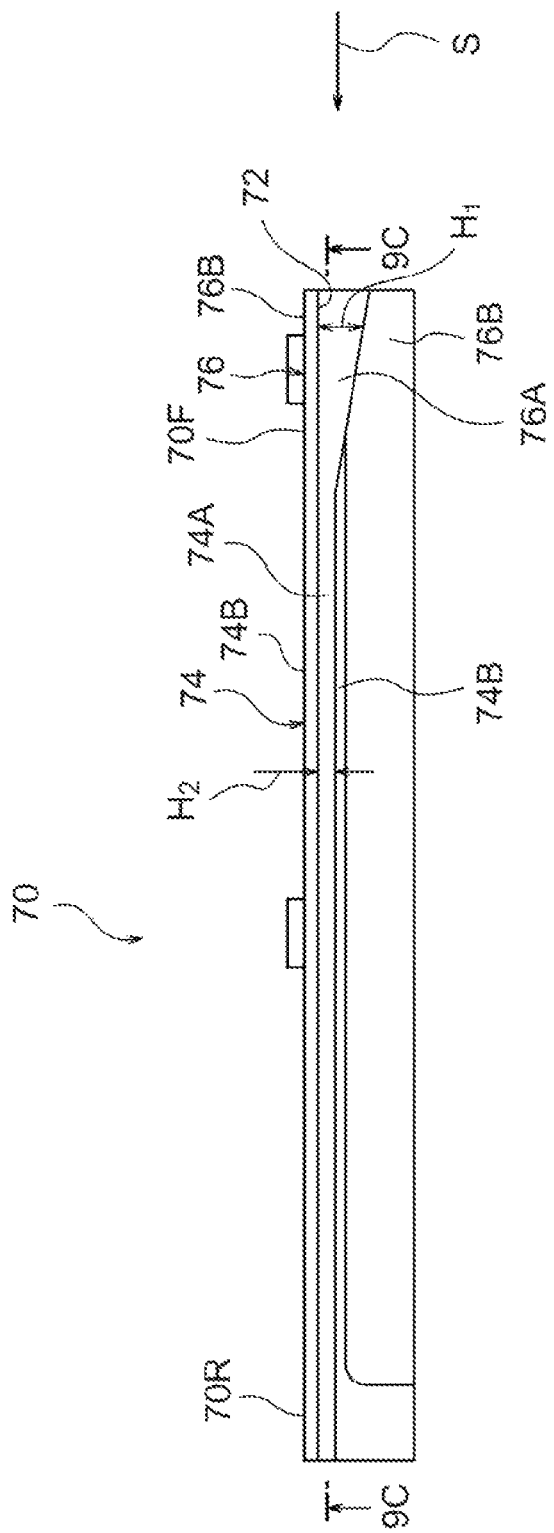

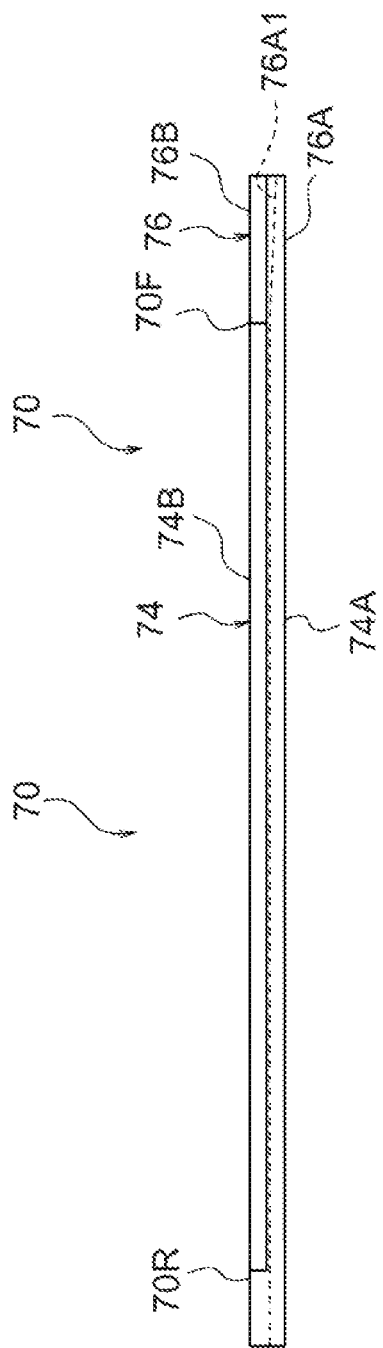

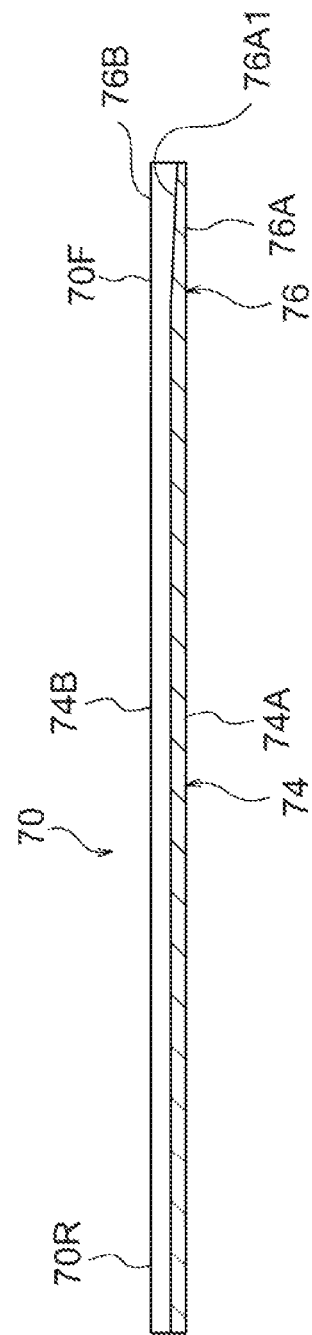

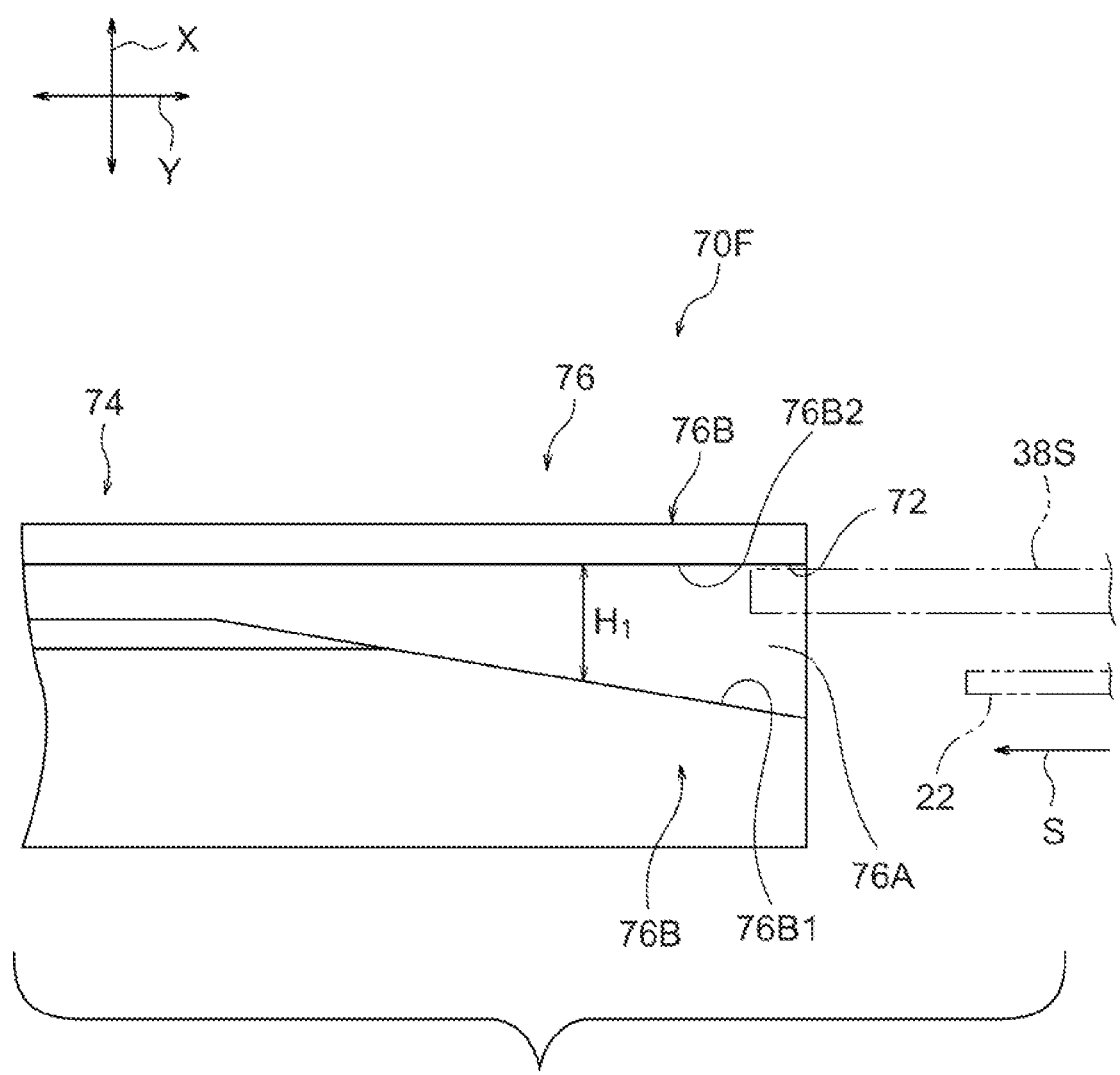

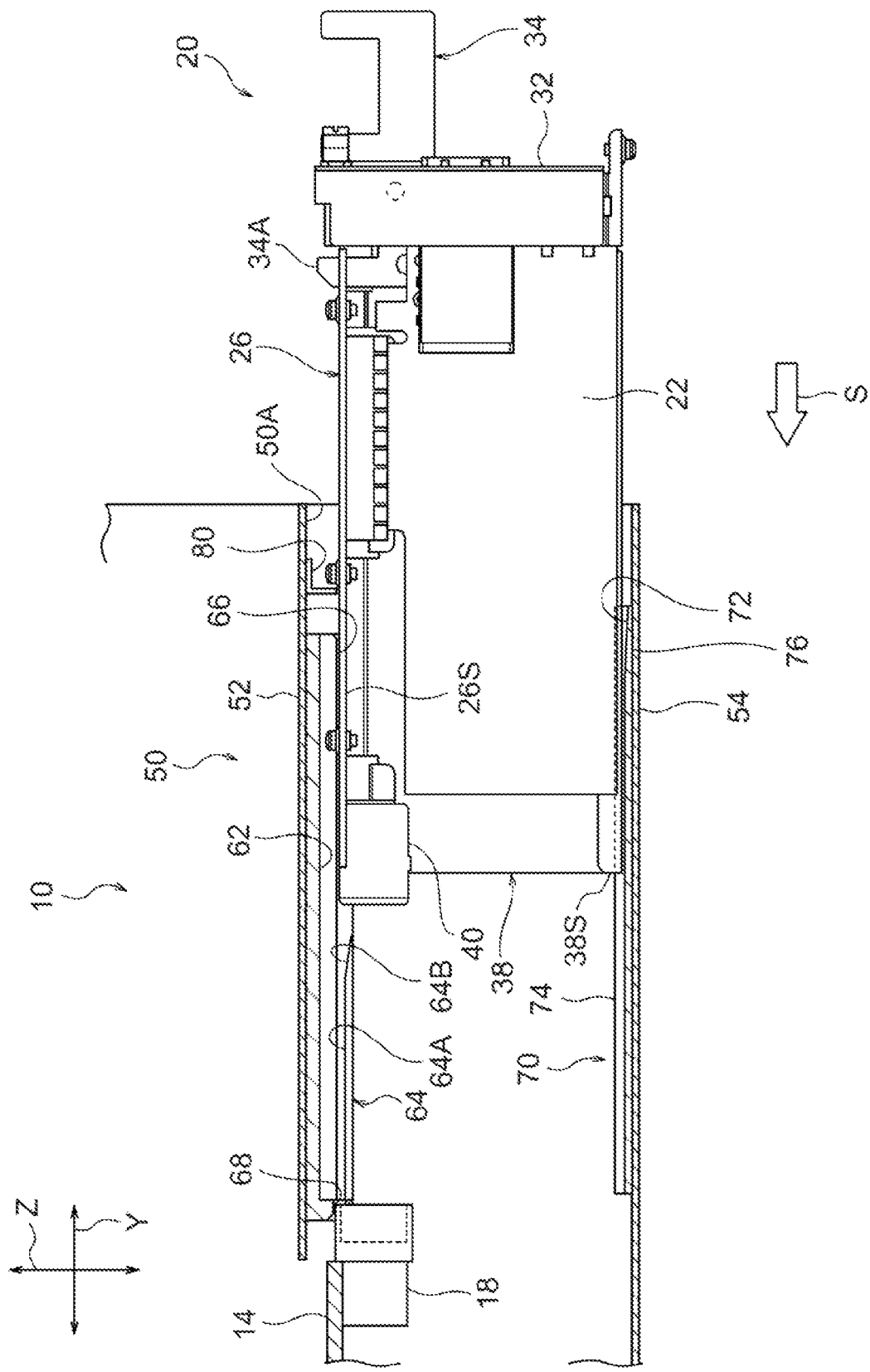

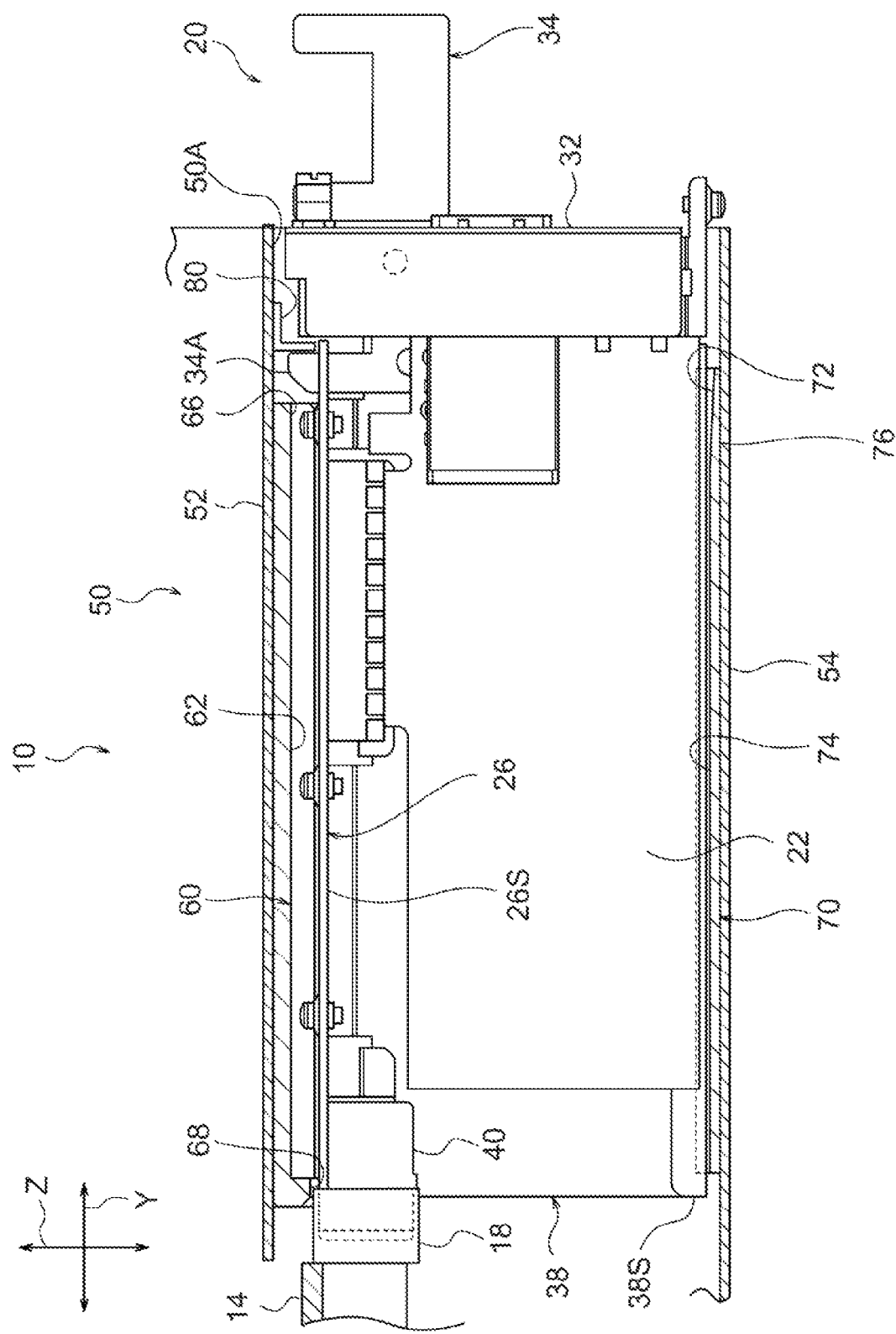

ELECTRONIC DEVICE AND PRINTED CIRCUIT BOARD CONNECTION METHOD

CROSS-REFERENCE TO RELATED APPLICATION

This application is based upon and claims the benefit of priority of the prior Japanese Patent Application No. 2012-044591, filed on Feb. 29, 2012, the entire contents of which are incorporated herein by reference.

FIELD

The embodiments discussed herein are related to an electronic device and a printed circuit board connection method.

BACKGROUND

Known electronic devices are provided with a main printed circuit board and include shelves that house plural sub-printed circuit boards connected to the main printed circuit board, with pairs of guide rails that guide the sub-printed circuit boards provided to the shelves. The pairs of guide rails are respectively formed with groove portions that slidably support upper edge portions and lower edge portions of the sub-printed circuit boards.

RELATED PATENT DOCUMENT

Japanese Laid-Open Utility Model Publication No. 61-173188
Japanese Laid-Open Patent Publication No. 02-034991

SUMMARY

According to an aspect of the embodiments, an electronic device includes: a casing provided with a first printed circuit board that includes a first connector; a unit inserted into the casing through a housing opening formed in the casing, the unit including a second printed circuit board with a second connector that connects to the first connector; a pair of guide rails that are provided inside the casing at a separation to each other in the top-bottom direction, that slidably support the unit inserted through the housing opening and that guide the second connector towards the first connector; a width direction positioning section that is provided to an end portion on the housing opening side of at least one of the guide rails of the pair of guide rails and that positions the second connector in the unit width direction with respect to the first connector; and a top-bottom direction positioning section that is positioned further towards the first connector side than the width direction positioning section and that positions the second connector in the top-bottom direction with respect to the first connector.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a front view of a rack of the rack mounting device illustrated in FIG. 3;

FIG. 11A is a plan view of a lower side guide rail of the rack mounting device illustrated in FIG. 3;

FIG. 11B is a side-on view of the lower side guide rail illustrated in FIG. 11A;

FIG. 11C is a cross-section taken on line 9C-9C of FIG. 11A;

FIG. 12 is an enlarged plan view of a portion of FIG. 11A;

FIG. 14 is a vertical cross-section corresponding to FIG. 6 and illustrating a state wherein a front portion of an expansion unit has been inserted into the rack illustrated in FIG. 3; and FIG. 15 is a vertical cross-section corresponding to FIG. 6 and illustrating a state wherein an expansion unit is housed in the rack illustrated in FIG. 3.

DESCRIPTION OF EMBODIMENTS

Explanation follows regarding an exemplary embodiment of an electronic device disclosed herein, with reference to the drawings. Note that in each of the drawings, the arrows X indicate the width direction of the electronic device (the device width direction), and the arrows Y indicate the depth direction of the electronic device (the device depth direction) as appropriate. The arrows Z indicate the top-bottom direction of the electronic device (the device top-bottom direction).

Figure 1:
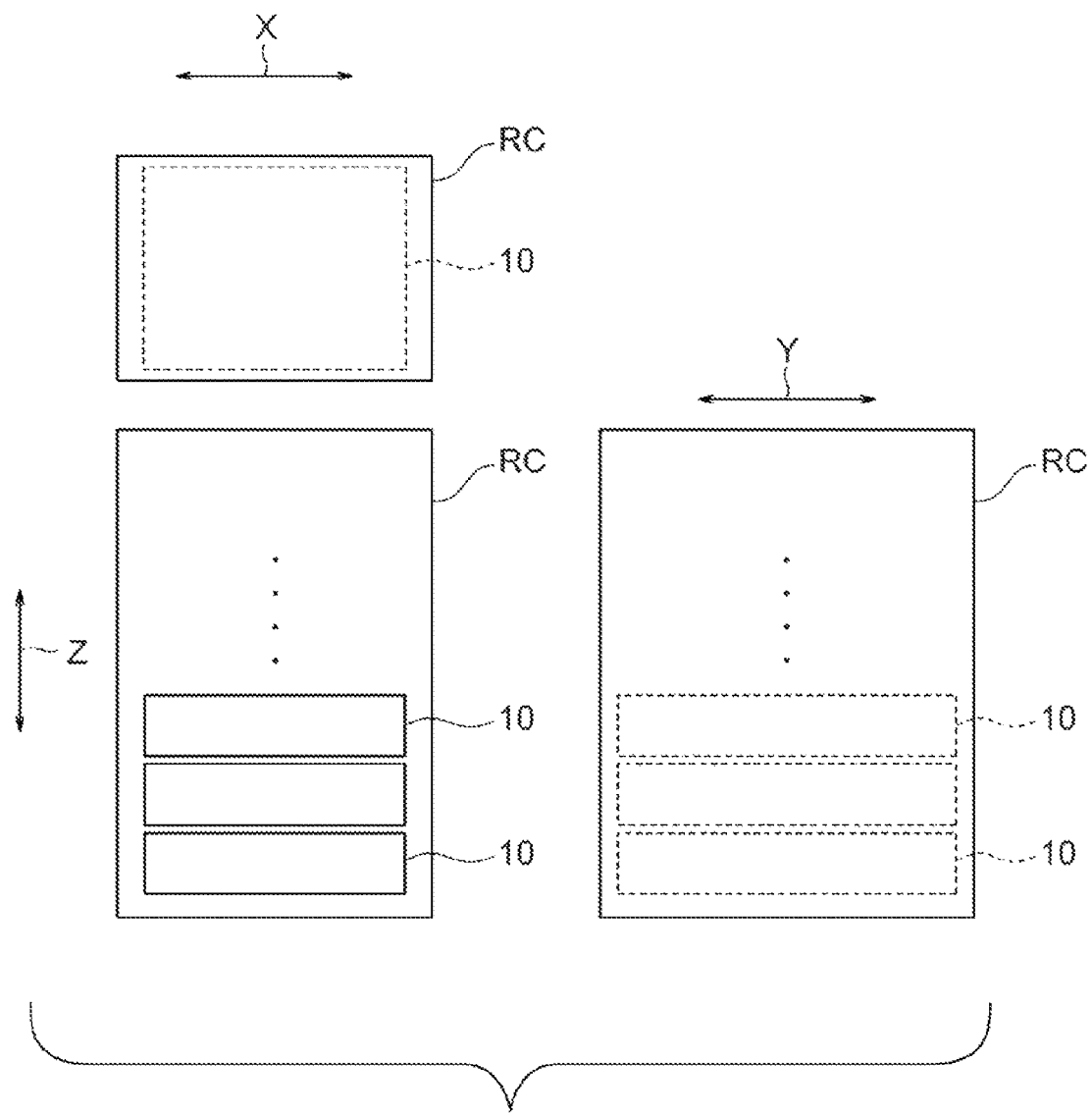
FIG. 1 includes a front view, top view and side view of a rack housing rack mounting devices of an exemplary embodiment of an electronic device.
Figure 2:
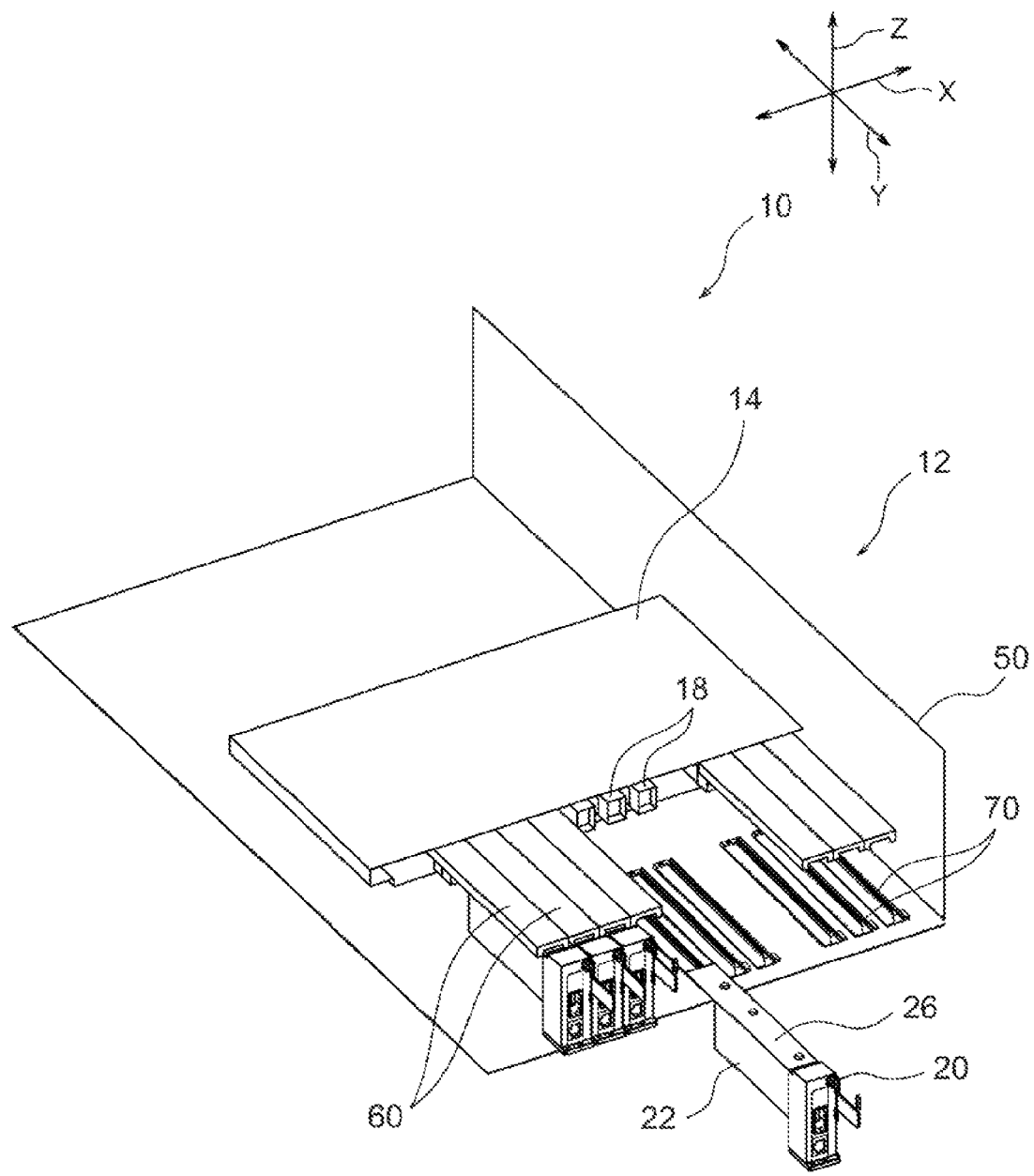
FIG. 2 is a perspective view of a rack mounting device of an exemplary embodiment of an electronic device.

FIG. 1 illustrates a rack RC in which plural rack mounting devices 10, serving as an example of an electronic device, are housed. As illustrated in FIG. 2, each rack mounting device 10 includes a device main body 12 and plural expansion units 20 detachably mounted to the device main body 12. The device main body 12 includes a main printed circuit board 14 serving as an example of a first printed circuit board, and a casing 50 housing the main printed circuit board 14. Note that the lowermost tier of the rack RC is illustrated in FIG. 2.

Explanation is first given regarding configuration of the expansion unit 20.

Figure 3:
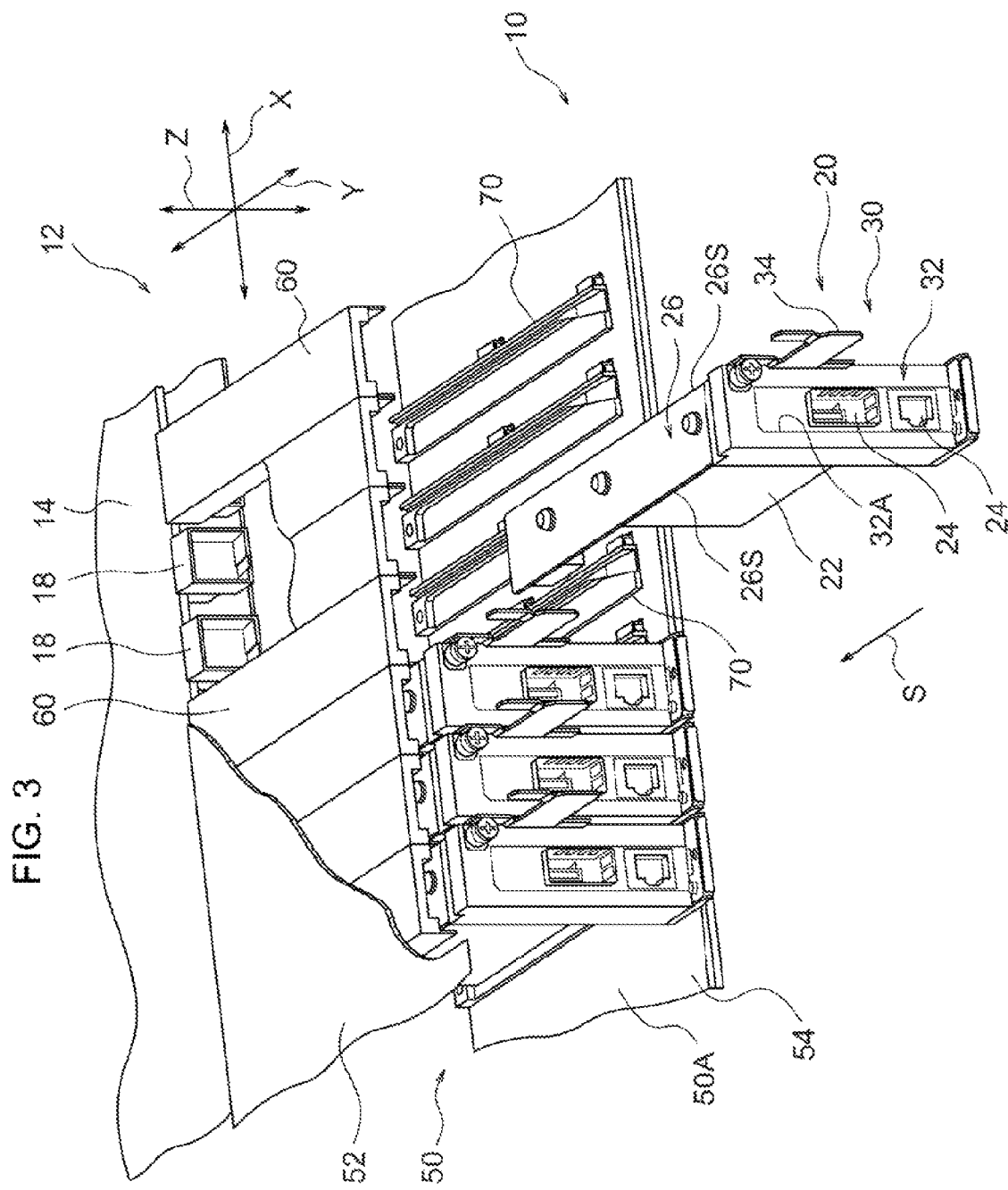
FIG. 3 is an enlarged perspective view of the rack mounting device illustrated in FIG. 2.

As illustrated in FIG. 3, the expansion unit 20 serving as an example of a unit is formed with an overall cuboid shape, and is removably inserted inside the casing 50 along the device depth direction (the arrow Y direction) though a housing opening 50A formed in the casing 50. The expansion unit 20 is housed inside the casing 50 in a state wherein the length direction (the front-rear direction) of the expansion unit 20 is oriented along the device depth direction and the width direction of the expansion unit 20 is oriented along the device width direction (the arrow X direction). Note that in each of the drawings the arrow S indicates the insertion direction far side of the expansion unit 20 to the casing 50 as appropriate.

The expansion unit 20 is configured as a plug-in type unit, and is provided with a sub-printed circuit board 22 serving as an example of a second printed circuit board, a connection printed circuit board 26 and a unit casing 30 that houses the sub-printed circuit board 22 and the connection printed circuit board 26.

The sub-printed circuit board 22 is for example an expansion board (expansion card) such as an interface board mounted with plural electronic components, and is disposed with the board thickness direction oriented along the expansion unit 20 width direction (in the arrow X direction). The sub-printed circuit board 22 is also formed with an electrical circuit that electrically connects the plural electronic components. Two connectors 24, connected for example to cables extending from other electronic devices, are provided at a front-rear direction rear end side of the sub-printed circuit board 22. The connectors 24 are electrically connected to the electrical circuit formed on the sub-printed circuit board 22.

Figure 4:
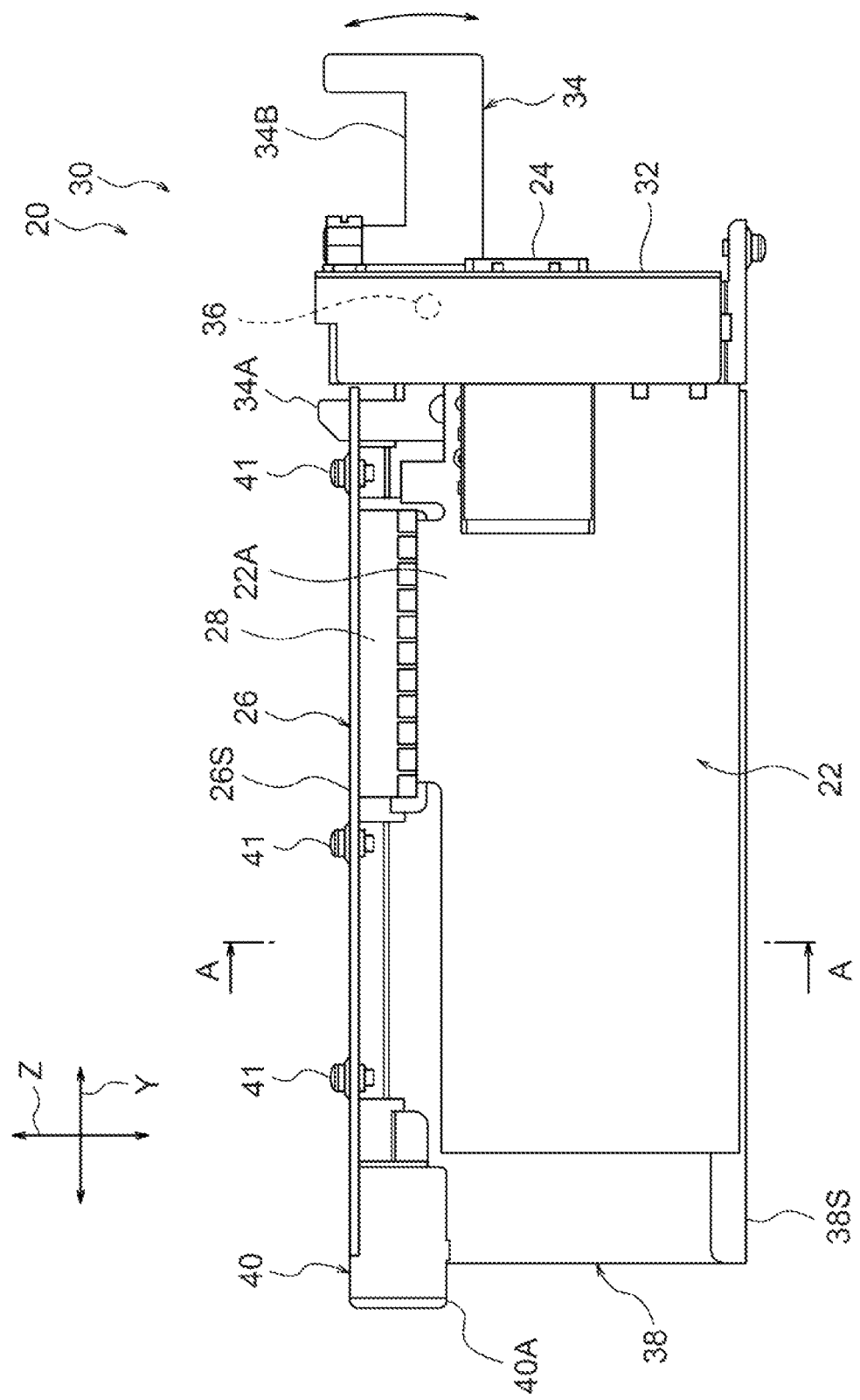
FIG. 4 is a side view of an expansion unit for mounting to the rack mounting device illustrated in FIG. 3.

The connection printed circuit board 26 that connects the sub-printed circuit board 22 and the main printed circuit board 14 provided in the casing 50 is disposed above the sub-printed circuit board 22. Similarly to the sub-printed circuit board 22, plural electrical components are mounted to the connection printed circuit board 26 and an electrical circuit is formed electrically connecting these electrical components. The connection printed circuit board 26 is disposed orthogonally to the sub-printed circuit board 22 with the board thickness direction oriented along the top-bottom direction (the arrow Z direction). As illustrated in FIG. 4, the lower face of the connection printed circuit board 26 is provided with a connector 28 that is inserted with a connection portion 22A formed to an upper edge portion of the sub-printed circuit board 22.

A second connector 40 is provided at a front end portion of the connection printed circuit board 26. The second connector 40 is formed in a box shape and is electrically connected to the electrical circuit formed on the connection printed circuit board 26. A beveled portion is formed by beveling a leading end portion of the second connector 40. The second connector 40 is inserted into a first connector 18 (see FIG. 3), described later, that is provided to the casing 50, thereby electrically connecting the electrical circuit on the sub-printed circuit board 22 and the electrical circuit of the main printed circuit board 14 through the connection printed circuit board 26.

Figure 5:
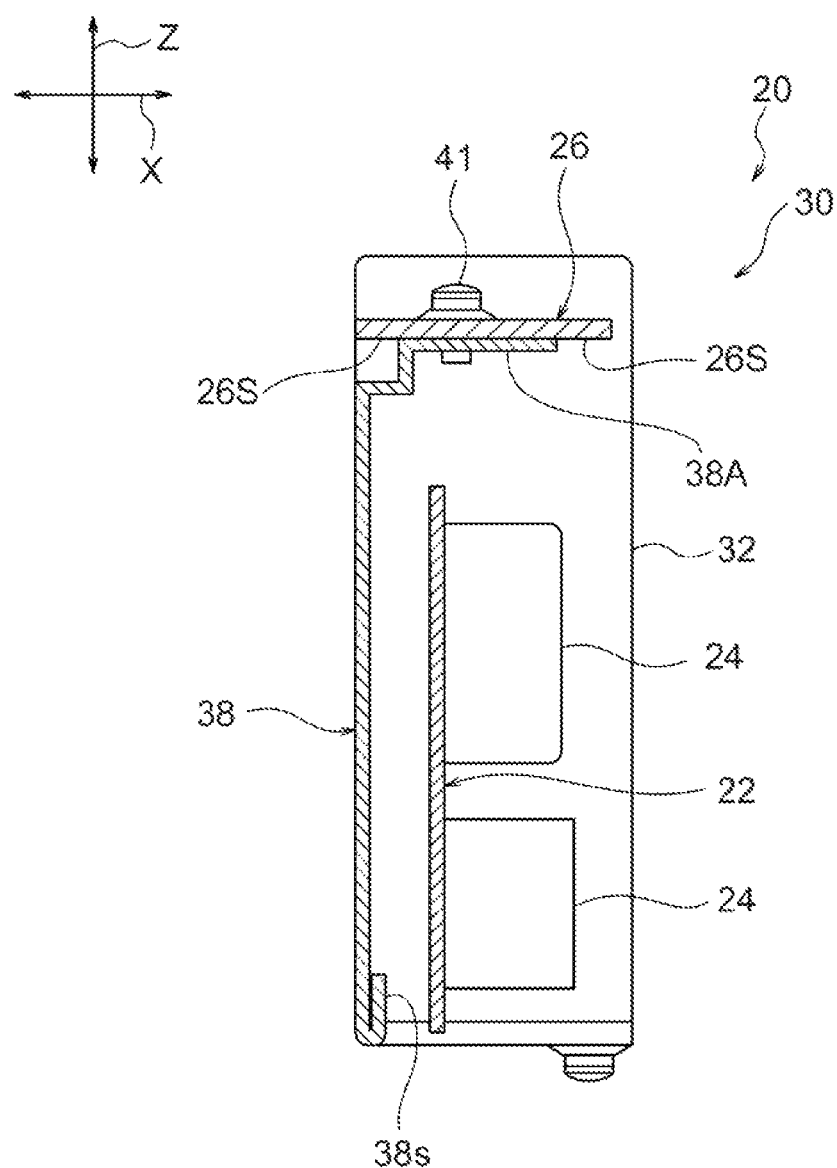
FIG. 5 is a front view of an expansion unit for mounting to the rack mounting device illustrated in FIG. 3.

As illustrated in FIG. 5, both width direction end portions of the connection printed circuit board 26 jut out to both sides in a board width direction (the arrow X direction) of the sub-printed circuit board 22. Both end portions of the connection printed circuit board 26 are provided with upper side slide portions 26S that are slidably supported by upper side guide rails 60, described later.

As illustrated in FIG. 4, the unit casing 30 includes a back cover 32 and a side cover 38. The back cover 32 is disposed to a rear side of the sub-printed circuit board 22 and is formed in a box shape open towards the sub-printed circuit board 22 side. A connection opening 32A (see FIG. 3) is formed to a rear face of the back cover 32, exposing two connectors 24 that are connected to the sub-printed circuit board 22.

The back cover 32 is also provided with an attachment-detachment lever 34 for fixing the expansion unit 20 to the casing 50. The attachment-detachment lever 34 extends in the expansion unit 20 front-rear direction and is rotatably supported at a length direction central portion by a rotation shaft 36 provided to the back cover 32. A front end portion of the attachment-detachment lever 34 disposed to the front side of the back cover 32 is formed with an engagement portion 34A that extends to above the connection printed circuit board 26. The engagement portion 34A engages with an engaged portion 80 (see FIG. 6), described later, that is provided to the casing 50.

A rear end side of the attachment-detachment lever 34 extending towards the rear side from the back cover 32 is formed with a handle portion 34B that is held by an operator. The engagement portion 34A provided at the front end portion of the attachment-detachment lever 34 moves downwards when the operator pulls the handle portion 34B upwards. As a result, the engagement portion 34A of the attachment-detachment lever 34 separates from the engaged portion 80 provided to the casing 50, releasing fixing of the expansion unit 20 to the casing 50.

Note that the engagement portion 34A of the attachment-detachment lever 34 is biased in an upwards direction by for example a spring and the engagement portion 34A is retained at a position that permits engagement with the engaged portion 80.

As illustrated in FIG. 5, the side cover 38 is formed for example from sheet metal in a plate shape, and is disposed facing the sub-printed circuit board 22 at a first board thickness direction side of the sub-printed circuit board 22. An attachment portion 38A is provided to an upper edge portion of the side cover 38 bending towards the sub-printed circuit board 22 side. The attachment portion 38A is disposed between the sub-printed circuit board 22 and the connection printed circuit board 26. The connection printed circuit board 26 is attached to the attachment portion 38A by screws 41.

A lower side slide portion 38S that is slidably supported by a lower side guide rail 70, described later, is provided at a lower edge portion of the side cover 38. The lower side slide portion 38S is formed by bending the side cover 38 towards the sub-printed circuit board 22 and back on itself at the lower edge portion of the side cover 38.

Explanation follows regarding configuration of the device main body 12.

Figure 6:
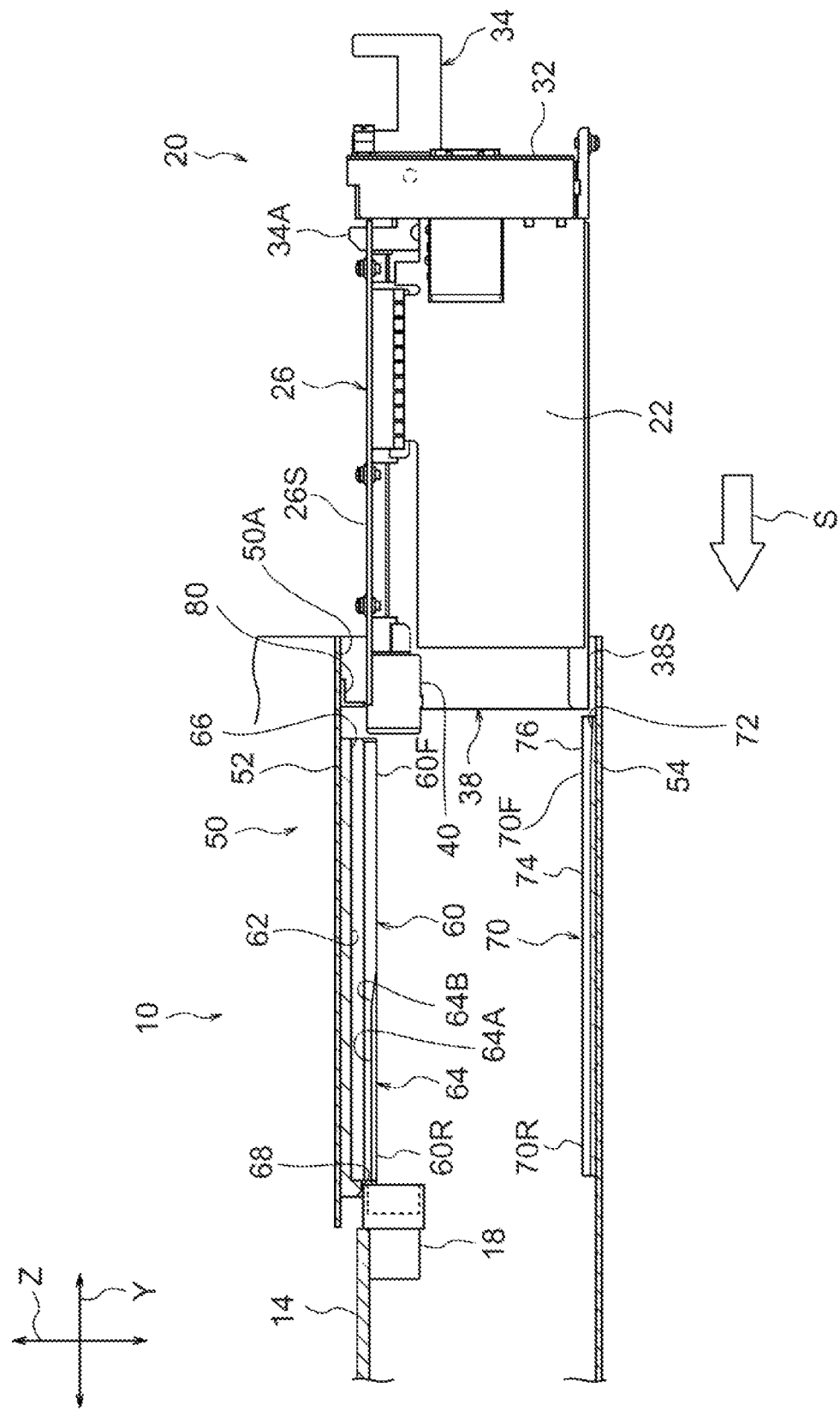
FIG. 6 is a vertical cross-section of the rack mounting device illustrated in FIG. 3.

As illustrated in FIG. 3 and FIG. 6, the device main body 12 includes the casing 50 that houses plural of the expansion units 20, as mentioned above. The casing 50 includes a pair of an upper wall portion 52 and a lower wall portion 54 facing each other along the device top-bottom direction, and a pair of side wall portions facing each other along the device width direction. Both sides of the casing 50 are open in the device depth direction. Plural of the expansion units 20 are housed in a row along the device width direction between the upper wall portion 52 and the lower wall portion 54.

The main printed circuit board 14 is provided at the far side of the casing 50. The main printed circuit board 14 configures for example a mother board (main board) mounted with plural electrical components such as a Central Processing Unit (CPU) and memory. The main printed circuit board 14 is also formed with an electrical circuit that electrically connects the plural electrical components. The main printed circuit board 14 is disposed with the board thickness direction oriented along the device top-bottom direction, and is supported by a frame provided to the casing 50.

Plural first connectors 18 to which the second connectors 40 of the expansion units 20 are connected are provided to end portions on the housing opening 50A side of the main printed circuit board 14. Each of the first connectors 18 is formed in a box shape open towards the housing opening 50A side, and is connected to the electrical circuit formed on the main printed circuit board 14. The first connectors 18 are disposed between the upper wall portion 52 and the lower wall portion 54 of the casing 50, on the upper wall portion 52 side, and one of the upper side guide rails 60, described later, is attached to each of the first connectors 18.

As illustrated in FIG. 6 and FIG. 7, the casing 50 is provided with pairs of an upper side guide rail 60 and a lower side guide rail 70 that slidably support the upper side slide portions 26S and the lower side slide portions 38S of the expansion units 20. The upper side guide rails 60 are provided to the lower face of the upper wall portion 52 of the casing 50, and the lower side guide rails 70 are provided on the upper face of the lower wall portion 54 of the casing 50. The upper side guide rails 60 and the lower side guide rails 70 are disposed with length directions oriented along the device depth direction and face each other in the device top-bottom direction. The second connectors 40 provided to the expansion units 20 are guided to the first connectors 18 provided to the casing 50 by the upper side guide rails 60 and the lower side guide rails 70. Note that one of the upper side guide rails 60 and one of the lower side guide rails 70 is an example of a pair of guide rails.

Figure 8A:
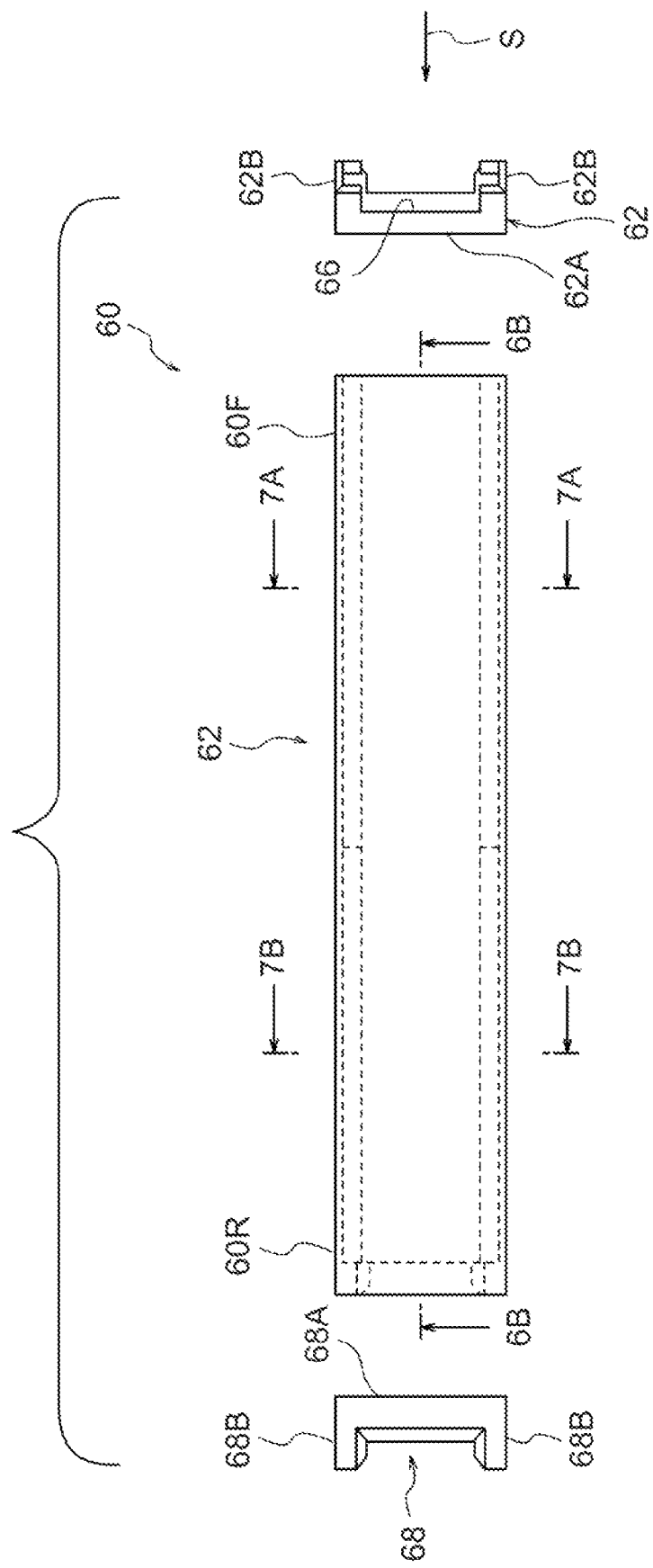
FIG. 8A includes a plan view, a right-hand view and a left-hand view of an upper side guide rail of the rack mounting device illustrated in FIG. 3.
Figure 8B:
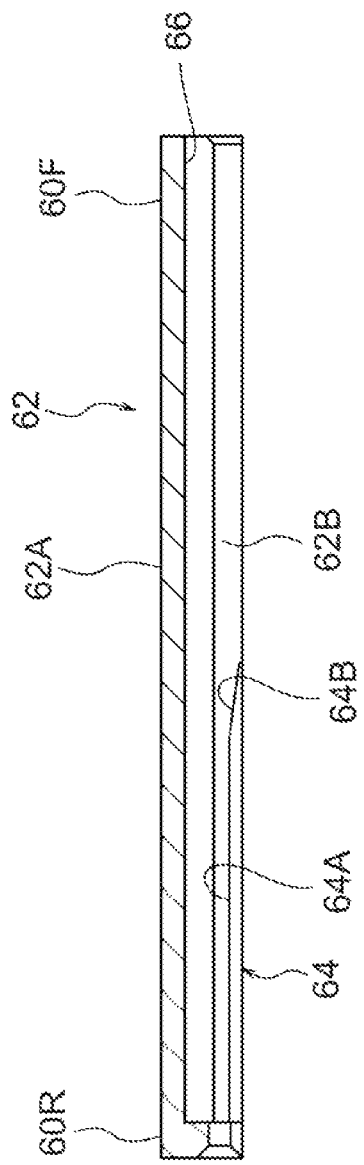
FIG. 8B is a cross-section taken on line 6B-6B of FIG. 8A.

Specifically, as illustrated in FIG. 8A and FIG. 8B, an insertion opening 66 into which the upper side slide portions 26S of the expansion unit 20 are inserted is formed to an end portion 60F of each upper side guide rail 60 on the housing opening 50A side (see FIG. 6). An upper side guide groove portion 62 that slidably supports the upper side slide portions 26S inserted through the insertion opening 66 is formed to the lower face of the upper side guide rail 60. Note that a beveled portion is formed by beveling peripheral edge portions of the insertion opening 66, allowing easily insertion of the upper side slide portions 26S of the expansion unit 20 into the insertion opening 66.

Figure 9A:
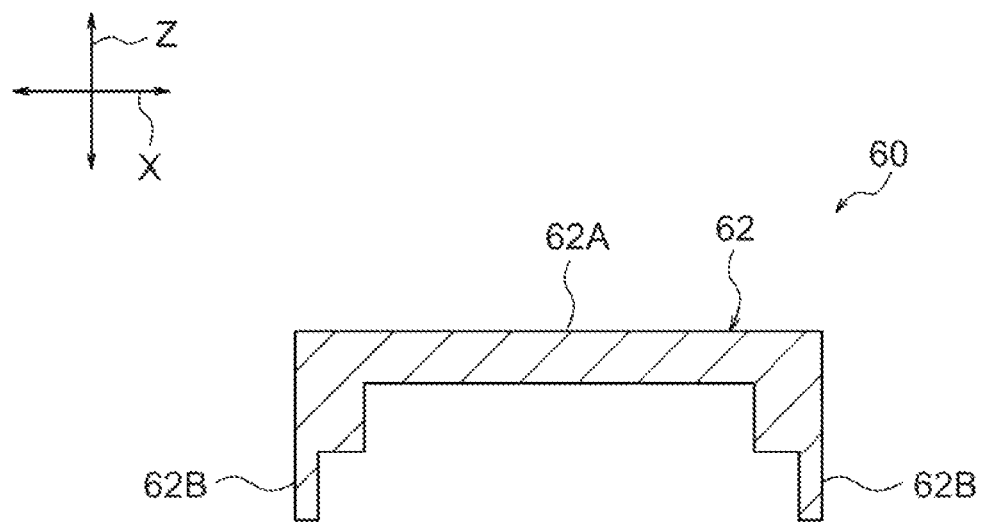
FIG. 9A is a cross-section taken on line 7A-7A of FIG. 8A.

The upper side guide groove portion 62 is formed with a groove profile open towards the bottom and extending in a straight line shape along the upper side guide rail 60. As illustrated in FIG. 9A, the upper side guide groove portion 62 includes a groove-bottom wall portion 62A and a pair of side wall portions 62B that face each other along the device width direction. The pair of side wall portions 62B slidably support the upper side slide portions 26S inserted through the insertion opening 66 (see FIG. 8A) from both device width direction sides.

Figure 9B:
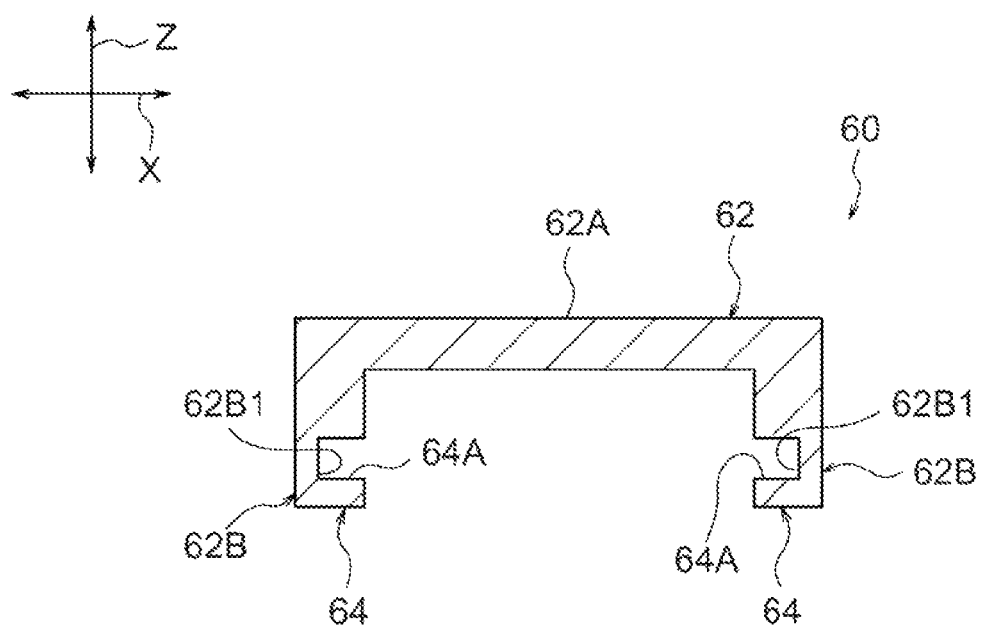
FIG. 9B is a cross-section taken on line 7B-7B of FIG. 8A.

As illustrated in FIG. 9B, a pair of guide ribs 64 that slidably support the upper side slide portions 26S of the expansion unit 20 from below are provided to the first connector 18 side of the upper side guide groove portion 62. The pair of guide ribs 64 are provided along lower end portions of each of the side wall portions 62B of the upper side guide groove portion 62, and project towards each other from inside faces 62B1 of each of the side wall portions 62B. Upper faces 64A of the guide ribs 64 are configured as horizontal faces.

As illustrated in FIG. 8B, end portions of the upper faces 64A of the pair of guide ribs 64 on the insertion opening 66 side (housing opening 50A side) are formed with inclined faces 64B that position the second connector 40 of the expansion unit 20 in the device top-bottom direction with respect to the first connector 18 of the casing 50. The inclined faces 64B are inclined downwards with respect to the upper faces 64A of the guide ribs 64 on progression towards the housing opening 50A side. The second connector 40 of the expansion unit 20 is positioned in the device top-bottom direction with respect to the first connector 18 of the casing 50 by the upper side slide portions 26S of the expansion unit 20 sliding over the inclined faces 64B.

Figure 10:
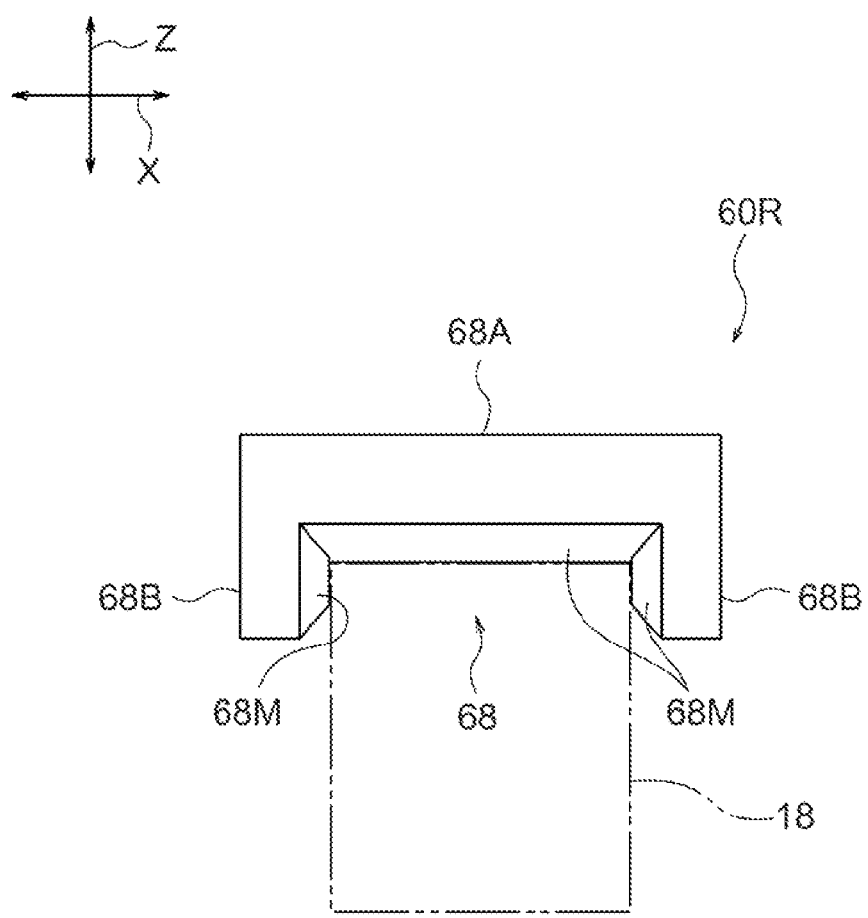
FIG. 10 is an enlarged left-hand view of the upper side guide rail illustrated in FIG. 8A.

As illustrated in FIG. 8A, an attachment groove portion 68 is provided to a first connector 18 end side end portion 60R of the upper side guide rail 60 and serves as an example of an attachment portion to which the first connector 18 is attached. The attachment groove portion 68 is formed to the lower face of the upper side guide rail 60 and includes a groove-bottom wall portion 68A and a pair of side wall portions 68B facing each other along the device width direction. As illustrated in FIG. 10, the upper side guide rail 60 is attached to the first connector 18 and the upper side guide rail 60 is positioned in the device width direction and the device top-bottom direction with respect to the first connector 18 by an upper portion of the first connector 18 fitting into the attachment groove portion 68. Note that a beveled portion 68M is formed by beveling a peripheral edge portion of the attachment groove portion 68, allowing the upper portion of the first connector 18 to fit into the attachment groove portion 68 easily.

As illustrated in FIG. 11A to FIG. 11C, an insertion opening 72 into which the lower side slide portion 38S of the expansion unit 20 is inserted is formed to an end portion 70F of the lower side guide rail 70 on the housing opening 50A side. A lower side guide groove portion 74 that slidably supports the lower side slide portion 38S inserted through the insertion opening 72 is formed to the upper face of the lower side guide rail 70.

The lower side guide groove portion 74 is formed with a groove profile open towards the top and extends in a straight line shape along the lower side guide rail 70. The lower side guide groove portion 74 includes a groove-bottom wall portion 74A and a pair of side wall portions 74B that face each other along the device width direction. The pair of side wall portions 74B slidably support the lower side slide portion 38S inserted through the insertion opening 72 from both device width direction sides. Note that a beveled portion is formed by beveling a peripheral edge portion of the insertion opening 72, allowing the lower side slide portion 38S to be inserted into the insertion opening 72 easily.

A wide groove portion 76, serving as an example of a width direction positioning section for positioning the second connector 40 of the expansion unit 20 in the device width direction with respect to the first connector 18 of the casing 50, is formed to an end portion 70F of the lower side guide rail 70. The wide groove portion 76 includes a groove-bottom wall portion 76A and a pair of side wall portions 76B that face each other along the device width direction, and is connected to the lower side guide groove portion 74. A groove width $H_1$ between the pair of side wall portions 76B in the wide groove portion 76 widens with respect to a groove width $H_2$ of the lower side guide groove portion 74 on progression towards the insertion opening 72 (the housing opening 50A side).

More specifically, as illustrated in FIG. 12, when the lower side slide portion 38S is inserted into the wide groove portion 76, an inside face 76B1 of a first of the side wall portions 76B positioned on the sub-printed circuit board 22 side is inclined as described below on progression towards the insertion opening 72 (the housing opening 50A). Namely, an inside face 76B1 of the first of the side wall portions 76B is inclined so as to be further away from an inside face 76B2 of the other of the side wall portions 76B positioned on the lower side slide portion 38S side on progression towards the insertion opening 72 (the housing opening 50A). In other words, the groove width $H_1$ of the wide groove portion 76 widens out towards the sub-printed circuit board 22 side on progression from the lower side guide groove portion 74 towards the insertion opening 72 (the housing opening 50A side). Moreover, as illustrated in FIG. 11C, an upper face 76A1 of the groove-bottom wall portion 76A of the wide groove portion 76 is configured as an inclined face that is inclined downwards on progression towards the insertion opening 72 (the housing opening 50A).

As illustrated in FIG. 6, the wide groove portion 76 is positioned so as to extend further to the housing opening 50A side than the insertion opening 66 of the upper side guide rail 60. Accordingly, when the expansion unit 20 is being inserted into the casing 50, the expansion unit 20 is guided by the wide groove portion 76 of the lower side guide rail 70 before being guided by the upper side guide rail 60.

The engaged portion 80, with which the engagement portion 34A of the attachment-detachment lever 34 provided to the expansion unit 20 engages, is provided to the bottom face of the upper wall portion 52 of the casing 50. The engaged portion 80 is formed from angled material with an L-shaped cross-section, and is disposed further to the housing opening 50A side of the rack RC than the upper side guide rail 60. The expansion unit 20 is fixed to the casing 50 by the engagement portion 34A of the attachment-detachment lever 34 engaging with the engaged portion 80.

Figure 13A:
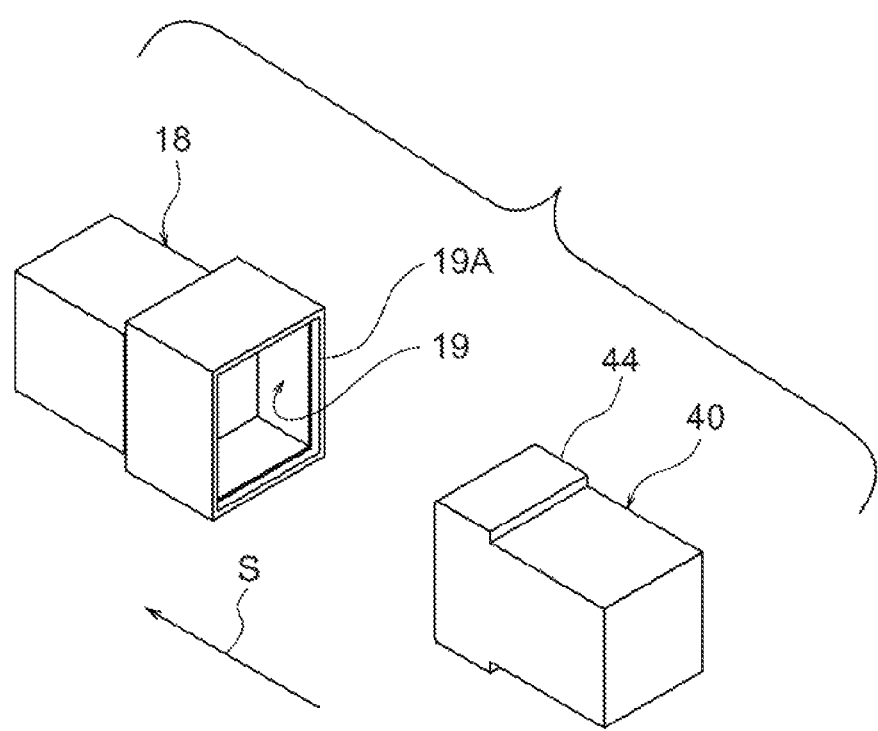
FIG. 13A and FIG. 13B are perspective views of a first connector and a second connector illustrated in FIG. 3.

As illustrated in FIG. 13A, a connection opening 19 into which an insertion portion 44 of the second connector 40 is inserted is provided to the first connector 18. An inner peripheral edge portion of the connection opening 19 is provided with a first tapered portion 19A extending around the entire periphery of the inner peripheral edge portion. The first tapered portion 19A is formed by beveling the inner peripheral edge portion of the connection opening 19. When the insertion portion 44 of the second connector 40 is being inserted into the connection opening 19 of the first connector 18, the insertion portion 44 of the second connector 40 is positioned by the first tapered portion 19A both in the device top-bottom direction and the device width direction with respect to the connection opening 19 of the first connector 18.

Figure 13B:
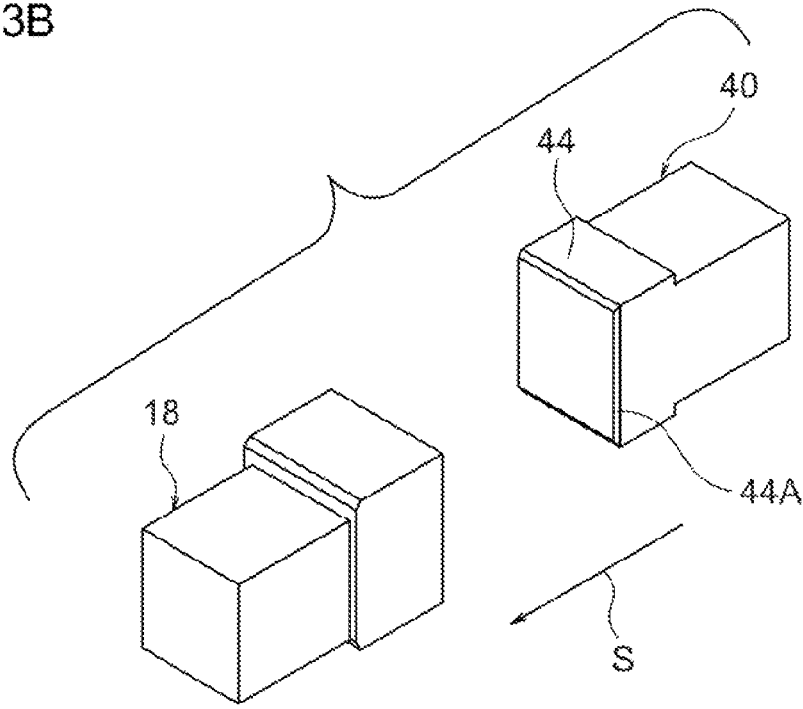

As illustrated in FIG. 13B, an outer peripheral edge portion of a leading end portion of the insertion portion 44 of the second connector 40 is provided with a second tapered portion 44A extending around the entire periphery of the outer peripheral edge portion. The second tapered portion 44A is formed by beveling the outer peripheral edge portion of the insertion portion 44. When the insertion portion 44 of the second connector 40 is being inserted into the connection opening 19 of the first connector 18, the insertion portion 44 of the second connector 40 is positioned by the second tapered portion 44A in both the device top-bottom direction and the device width direction with respect to the connection opening 19 of the first connector 18.

Explanation follows regarding a method of mounting the expansion unit 20 to the casing 50.

First, as illustrated in FIG. 6, the expansion unit 20 is inserted through the housing opening 50A formed in the casing 50 as an example of inserting. Then the lower side slide portion 38S of the expansion unit 20 is inserted into the insertion opening 72 of the lower side guide rail 70 provided to the lower wall portion 54 of the casing 50, as an example of sliding. The lower side slide portion 38S that has been inserted into the lower side guide rail 70 through the insertion opening 72 is guided to the lower side guide groove portion 74 by the wide groove portion 76. When this is performed, as illustrated in FIG. 14, the upper side slide portions 26S of the expansion unit 20 are inserted into the insertion opening 66 of the upper side guide rail 60 provided to the upper wall portion 52 of the casing 50. The upper side slide portions 26S that have been inserted into the upper side guide rail 60 through the insertion opening 66 then slide along the upper side guide groove portion 62. The second connector 40 provided to the expansion unit 20 is accordingly positioned in the device width direction with respect to the first connector 18 provided to the casing 50.

When the expansion unit 20 is, in this state, inserted further into the casing 50, the upper side slide portions 26S of the expansion unit 20 slide along the inclined faces 64B formed to the guide ribs 64, as an example of further sliding. The second connector 40 of the expansion unit 20 is accordingly positioned in the device top-bottom direction with respect to the first connector 18 of the casing 50.

As illustrated in FIG. 15, when the expansion unit 20 is inserted into the casing 50, the second connector 40 of the expansion unit 20 is connected to the first connector 18 of the casing 50. When this is performed, as illustrated in FIG. 13A and FIG. 13B, the insertion portion 44 of the second connector 40 is guided to the connection opening 19 of the first connector 18 due to the second tapered portion 44A provided to the insertion portion 44 of the second connector 40 sliding along the first tapered portion 19A provided to the connection opening 19 of the first connector 18. The second connector 40 is accordingly positioned in both the device top-bottom direction and the device width direction with respect to the first connector 18, and the second connector 40 is connected to the first connector 18. As a result, the sub-printed circuit board 22 of the expansion unit 20 is electrically connected to the main printed circuit board 14 of the casing 50 through the first connector 18 and the second connector 40.

When the second connector 40 has been connected to the first connector 18, the engagement portion 34A of the attachment-detachment lever 34 provided to the expansion unit 20 is engaged with the engaged portion 80 provided to the upper wall portion 52 of the casing 50. The expansion unit 20 is accordingly fixed to the casing 50.

Explanation follows regarding operation of a rack mounting device according to the present exemplary embodiment.

As illustrated in FIG. 6, the end portion 70F of the lower side guide rail 70 on the housing opening 50A side is provided with the wide groove portion 76. The second connector 40 of the expansion unit 20 is positioned in the device width direction with respect to the first connector 18 of the casing 50 by the lower side slide portion 38S of the expansion unit 20 being slidably supported from both sides in the board thickness direction by the wide groove portion 76.

As illustrated in FIG. 12, the groove width $H_1$ of the wide groove portion 76 widens on progression towards the insertion opening 72 (the housing opening 50A side). Ease of operation during operation to house the expansion unit 20 in the casing 50 is accordingly enhanced, since the lower side slide portion 38S of the expansion unit 20 can easily be inserted into the insertion opening 72 of the lower side guide rail 70. Namely, ease of operation during operation to house the sub-printed circuit board 22 in the casing 50 is enhanced. In the present exemplary embodiment, this is particularly helpful in the case of the lowermost shelf of the rack RC (see FIG. 1) in which it is difficult to see the upper side guide rail 60 and the lower side guide rail 70.

The inside face 76B1 of a first of the side wall portions 76B of the wide groove portion 76 is also inclined so as to be further away from the inside face 76B2 of the other of the side wall portions 76B on progression towards the insertion opening 72 (the housing opening 50A side). In other words, the groove width $H_1$ of the wide groove portion 76 widens out towards the sub-printed circuit board 22 side on progression from the lower side guide groove portion 74 towards the insertion opening 72 (the housing opening 50A side). The device width of the expansion unit 20 is accordingly narrower than in a configuration wherein the groove width $H_1$ of the wide groove portion 76 widens away towards the lower side slide portion 38S side on progression from the lower side guide groove portion 74 towards the insertion opening 72 (the housing opening 50A side). That is to say, a reduction in size in the width direction can be achieved for the expansion unit 20. The number of expansion units 20 that can be mounted to the casing 50 can accordingly be increased.

As illustrated in FIG. 6, the pair of guide ribs 64 are provided to the upper side guide groove portion 62 of the upper side guide rail 60 at the first connector 18 side. The end portions of the upper faces 64A of the pair of guide ribs 64 on the insertion opening 66 side (the housing opening 50A side) are respectively formed with the inclined faces 64B that incline downwards with respect to the upper faces 64A towards the housing opening 50A side. The upper side slide portions 26S of the expansion unit 20 are hence slidably supported from below by the inclined faces 64B, thereby positioning the second connector 40 of the expansion unit 20 in the device top-bottom direction with respect to the first connector 18 of the casing 50.

Accordingly in the present exemplary embodiment, the inclined faces 64B position the second connector 40 of the expansion unit 20 in the device top-bottom direction with respect to the first connector 18 of the casing 50 on the first connector 18 side of the upper side guide rail 60. The amount of positional misalignment of the second connector 40 in the device top-bottom direction with respect to the first connector 18 is accordingly reduced compared to a configuration wherein the second connector 40 is positioned in the device top-bottom direction with respect to the first connector 18 at the housing opening 50A side of the upper side guide rail 60.

Moreover, in the present exemplary embodiment the pair of guide ribs 64 is only provided at the first connector 18 side of the upper side guide rail 60. In the present exemplary embodiment, savings can accordingly be made in the manufacturing cost of the upper side guide rail 60 in comparison to a configuration in which the pair of guide ribs 64 are provided along the entire length of the upper side guide rail 60.

As illustrated in FIG. 13A and FIG. 13B, in the present exemplary embodiment the first tapered portion 19A is provided to the connection opening 19 of the first connector 18, and the second tapered portion 44A is provided to the insertion portion 44 of the second connector 40. The second connector 40 is hence positioned with respect to the first connector 18 in both the device top-bottom direction and the device width direction by the first tapered portion 19A and the second tapered portion 44A. In the present exemplary embodiment, the amount of positional misalignment of the second connector 40 with respect to the first connector 18 in the device top-bottom direction and the device width direction is reduced in comparison to a configuration in which the first tapered portion 19A and the second tapered portion 44A are not provided.

As illustrated in FIG. 10, the attachment groove portion 68 is provided to the first connector 18 side end portion 60R of the upper side guide rail 60. The first connector 18 fits into the attachment groove portion 68, attaching the end portion 60R of the upper side guide rail 60 to the first connector 18. Namely, the upper side guide rail 60 is directly positioned with respect to the first connector 18. The precision with which the upper side guide rail 60 guides the upper side slide portions 26S of the expansion unit 20 is thereby enhanced.

As illustrated in FIG. 5, in the present exemplary embodiment the upper side slide portions 26S are provided to the connection printed circuit board 26 and the lower side slide portion 38S is provided to the side cover 38 of the unit casing 30. Accordingly in the present exemplary embodiment, the number of electrical components that can be mounted on the sub-printed circuit board 22 is increased in comparison to a configuration wherein the upper side slide portions 26S and the lower side slide portion 38S are provided on the sub-printed circuit board 22. Namely, electronic components can be mounted on the sub-printed circuit board 22 at high density.

Accordingly in the present exemplary embodiment, the amount of positional misalignment in the top-bottom direction between a first connector on a first printed circuit board and a second connector on a second printed circuit board can be reduced during an operation to house the second printed circuit board in a casing.

Explanation follows regarding modified examples of the electronic device according to the above exemplary embodiment.

In the above exemplary embodiment, the groove width $H_1$ of the wide groove portion 76 provided to the lower side guide rail 70 widens out towards the sub-printed circuit board 22 side on progression from the lower side guide groove portion 74 towards the housing opening 50A side, however there is no limitation thereto. For example, the groove width $H_1$ of the wide groove portion 76 may widen out towards the lower side slide portion 38S side on progression from the lower side guide groove portion 74 towards the housing opening 50A side. The groove width $H_1$ of the wide groove portion 76 may also widen out towards both the sub-printed circuit board 22 side and the lower side slide portion 38S side on progression from the lower side guide groove portion 74 towards the housing opening 50A side.

In the above exemplary embodiment, the wide groove portion 76 is provided to the lower side guide rail 70, however the wide groove portion 76 may be provided to the upper side guide rail 60. In such cases, the wide groove portion 76 of the upper side guide rail 60 is positioned further towards the housing opening 50A side than the insertion opening 72 of the lower side guide rail 70. Accordingly, when the expansion unit 20 is inserted into the casing 50, the expansion unit 20 is guided by the wide groove portion 76 provided to the upper side guide rail 60 before being guided by the lower side guide rail 70. Wide groove portions 76 may also be provided to both the upper side guide rail 60 and the lower side guide rail 70. Namely, the wide groove portion 76 may be provided to the upper side guide rail 60, or to the lower side guide rail 70, or to the upper side guide rail 60 and the lower side guide rail 70.

Further, in the above exemplary embodiment, the inclined faces 64B are provided on the first connector 18 side of the upper side guide rail 60, however there is no limitation thereto. The inclined faces 64B may be positioned further towards the first connector 18 side than the wide groove portion 76, and the inclined faces 64B may be provided on the housing opening 50A side of the upper side guide rail 60.

In the above exemplary embodiment, the inclined faces 64B serving as an example of a top-bottom direction positioning section are provided to the upper side guide rail 60, however the top-bottom direction positioning section may be provided to the upper side guide rail 60, or to the lower side guide rail 70, or to the upper side guide rail 60 and the lower side guide rail 70. If the top-bottom direction positioning section is provided to the lower side guide rail 70, for example the upper face of the groove-bottom wall portion 74A of the lower side guide groove portion 74 may be formed with an inclined face that inclines downwards on progression towards the housing opening 50A. The top-bottom direction positioning section may also be provided to a member other than the upper side guide rail 60 or the lower side guide rail 70.

In the above exemplary embodiment, the end portion 60R of the upper side guide rail 60 is attached to the first connector 18, however there is no limitation thereto. For example, the first connector 18 may be disposed towards the lower wall portion 54 side of the casing 50 and the first connector 18 side end portion 70R of the lower side guide rail 70 may be attached to the first connector 18. In such cases, the top-bottom direction positioning section described above is preferably provided to the first connector 18 side of the lower side guide rail 70.

In the above exemplary embodiment, the upper side slide portions 26S are provided to the connection printed circuit board 26 of the expansion unit 20, however there is no limitation thereto. For example, upper side slide portions may be provided projecting out towards both board thickness direction sides of the sub-printed circuit board 22, at both side portions of the second connector 40 of the expansion unit 20. An upper side slide portion may also be provided to the unit casing 30 or the sub-printed circuit board 22. The connection printed circuit board 26 can also be omitted as appropriate. In cases in which the connection printed circuit board 26 is omitted, the second connector 40 may be directly connected to the electrical circuit formed on the sub-printed circuit board 22.

In the above exemplary embodiment, the first tapered portion 19A is provided to the first connector 18 and the second tapered portion 44A is provided to the second connector 40, however there is no limitation thereto. A tapered portion similar to the first tapered portion 19A or the second tapered portion 44A may be provided to the first connector 18, or to the second connector 40, or to the first connector 18 and the second connector 40. The first tapered portion 19A or the second tapered portion 44A may also be omitted as appropriate.

In the above exemplary embodiment, the lower side slide portion 38S is provided to the lower edge portion of the side cover 38 configuring the unit casing 30, however there is no limitation thereto. For example, a lower side slide portion may be provided to a different member configuring the unit casing 30, or a lower side slide portion may be provided to a lower edge portion of the sub-printed circuit board 22.

Explanation has been given above of an exemplary embodiment of the technology disclosed in the present application, however the technology disclosed in the present application is not limited by the exemplary embodiment described above. Appropriate combinations of the exemplary embodiment and any of the modified examples above may be employed, and it goes without saying that various embodiments may be implemented within a range not departing from the spirit of the technology of the present application.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising: a casing provided with a first printed circuit board that includes a first connector; a unit inserted into the casing through a housing opening formed in the casing, the unit including a second printed circuit board with a second connector that connects to the first connector; a pair of guide rails that are provided inside the casing at a separation to each other in the top-bottom direction, that slidably support the unit inserted through the housing opening and that guide the second connector towards the first connector; a width direction positioning section that is provided to an end portion on the housing opening side of at least one of the guide rails of the pair of guide rails and that positions the second connector in the unit width direction with respect to the first connector; and a top-bottom direction positioning section that is positioned further towards the first connector side than the width direction positioning section and that positions the second connector in the top-bottom direction with respect to the first connector, wherein an end portion on the first connector side of either of the guide rails is attached to the first connector, and wherein the unit includes an upper side slide portion jutting out to both board thickness direction sides of the second printed circuit board;

the guide rail on the upper side includes an upper side guide groove portion that extends along the guide rail and slidably supports the upper side slide portion from both board thickness direction sides, and a pair of guide ribs that project out from each inside face of the upper side guide groove portion towards each other and slidably support the upper side slide portion from below.

2. The electronic device of claim 1, wherein the top-bottom direction positioning section is provided to at least one of the pair of guide rails.

3. The electronic device of claim 1, wherein the either of the guide rails configures an upper side guide rail, and the top-bottom direction positioning section is provided to the upper side guide rail on the first connector side.

4. The electronic device of claim 1, wherein a first tapered portion is provided to an inner peripheral edge portion of a connection opening of the first connector that connects with the second connector, and the first tapered portion extends along the inner peripheral edge portion.

5. The electronic device of claim 1, wherein a second tapered portion is provided to an outer peripheral portion of a leading end portion of the second connector that is inserted into the connection opening provided to the first connector, and the second tapered portion extends along the outer peripheral edge portion.

6. An electronic device comprising:
a casing provided with a first printed circuit board that includes a first connector;
a unit inserted into the casing through a housing opening formed in the casing, the unit including a second printed circuit board with a second connector that connects to the first connector;
a pair of guide rails that are provided inside the casing at a separation to each other in the top-bottom direction, that slidably support the unit inserted through the housing opening and that guide the second connector towards the first connector;
a width direction positioning section that is provided to an end portion on the housing opening side of at least one of the guide rails of the pair of guide rails and that positions the second connector in the unit width direction with respect to the first connector; and
a top-bottom direction positioning section that is positioned further towards the first connector side than the width direction positioning section and that positions the second connector in the top-bottom direction with respect to the first connector, wherein
the second printed circuit board is disposed with the board thickness direction oriented along the unit width direction;

the unit includes an upper side slide portion jutting out to both board thickness direction sides of the second printed circuit board;

the guide rail on the upper side includes an upper side guide groove portion that extends along the guide rail and slidably supports the upper side slide portion from both board thickness direction sides, and a pair of guide ribs that project out from each inside face of the upper side guide groove portion towards each other and slidably support the upper side slide portion from below; and the top-bottom direction positioning section is configured by inclined faces that are formed to an upper face of the pair of guide ribs and are inclined downwards on progression towards the housing opening side.

7. The electronic device of claim 6, wherein the unit includes a lower side slide portion disposed at a first board thickness direction side of the second printed circuit board; and the width direction positioning section is configured by a wide groove portion that is provided at an end portion at the housing opening side of the guide rail on the lower side and that slidably supports the lower side slide portion from both board thickness direction sides, the groove width of the wide groove portion widening on progression towards the housing opening side.

8. The electronic device of claim 7, wherein an inside face on the second printed circuit board side of the wide groove portion is inclined so as to be further away from an inside face on the lower side slide portion side of the wide groove portion on progression towards the housing opening side.

* * * * *